(12) United States Patent
Kubota

(10) Patent No.: US 6,319,790 B1
(45) Date of Patent: Nov. 20, 2001

(54) PROCESS FOR FABRICATING SEMICONDUCTOR DEVICE WITH MULTIPLE CYLINDRICAL CAPACITOR

(75) Inventor: Ryo Kubota, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/626,458

(22) Filed: Jul. 26, 2000

(30) Foreign Application Priority Data

Jul. 28, 1999 (JP) ................................. 11-214211

(51) Int. Cl.[7] ................................................ H01L 21/20
(52) U.S. Cl. .................... 438/396; 438/253; 438/254; 438/397; 438/398; 438/745; 437/47; 437/60; 437/195
(58) Field of Search .................... 438/396, 397, 438/253, 254, 738, 398, 745; 437/47, 60, 195

(56) References Cited

U.S. PATENT DOCUMENTS

| | | | |
|---|---|---|---|
| 5,185,282 | * | 2/1993 | Lee et al. .............................. 437/47 |
| 5,248,629 | * | 9/1993 | Muroyama .............................. 437/52 |
| 5,663,093 | * | 9/1997 | Tseng et al. .......................... 438/396 |
| 5,736,450 | * | 4/1998 | Huang et al. ......................... 438/396 |

FOREIGN PATENT DOCUMENTS

| | | |
|---|---|---|
| 9-129845 | 5/1997 | (JP) . |
| 9-219499 | 8/1997 | (JP) . |

* cited by examiner

*Primary Examiner*—Richard Elms
*Assistant Examiner*—Pho Luu
(74) *Attorney, Agent, or Firm*—Sughrue, Mion, Zinn, Macpeak & Seas, PLLC

(57) ABSTRACT

A method for making a semiconductor device is provided. In the method, an insulating layer is formed over a semiconductor substrate, and a groove is formed in the insulating layer. Then, a first conductive layer, a first mask layer, a second conductive layer, and a second mask layer are sequentially and conformably formed on an upper surface of the insulating layer and an inner surface of the groove to form a laminated layer. Afterwards, the laminated layer is anisotropically etched to form a multiple cylindrical structure in the groove, and a multiple cylindrical electrode is formed based on the multiple cylindrical structure. Subsequently, a dielectric layer and a plate electrode are sequentially formed on the multiple cylindrical electrode to create a capacitor.

33 Claims, 6 Drawing Sheets

US 6,319,790 B1

PROCESS FOR FABRICATING SEMICONDUCTOR DEVICE WITH MULTIPLE CYLINDRICAL CAPACITOR

FIELD OF THE INVENTION

This invention relates to a fabrication technology for a semiconductor device and, more particularly, to a process for fabricating a semiconductor device with a multiple cylindrical capacitor.

DESCRIPTION OF THE RELATED ART

A dynamic random access memory is a typical example of the semi-conductor device. Dynamic random access memory cells are integrated on a semiconductor chip together with peripheral circuits. A popular circuit configuration of the dynamic random access memory cell is implemented by a series combination of an access transistor and a storage capacitor. The circuit configuration is so simple that the dynamic random access memory achieves large data storage density. However, a problem is encountered in the dynamic random access memory cell. When the dynamic random access memory cell is scaled down, the capacitance is too small to hold a data bit in the storage capacitor over a refreshing cycle. In order to increase the capacitance without sacrifice of the occupation area, various three-dimensional structures have been proposed.

The three-dimensional storage capacitors are categorized into two groups. The first group is called as "stacked capacitor", and the second group is "trench capacitor". There is a trade-off between the stacked capacitor and the trench capacitor. The stacked capacitor is superior to the trench capacitor in resistance against alpha-particles and noise from the peripheral circuits. This feature is attractive, because, even if the stacked capacitor is not large in capacitance, the data holding characteristics are stable. For this reason, the manufacturers think it appropriate to employ the stacked capacitors in 4-Gbit semiconductor random access memory devices designed under 0.13 micron rules for the next generation.

A storage capacitor with a cylindrical storage node is classified in the stacked capacitor. The storage capacitor with a cylindrical storage electrode is hereinbelow referred to as "cylindrical stacked capacitor". Typical examples of the cylindrical stacked capacitor are disclosed in Japanese Patent Publication of Unexamined Application (laid-open) Nos. 9-129845 and 9-219499. The prior art cylindrical stacked capacitor has a multiple cylindrical structure so as to increase the surface area of the storage electrode.

The prior art cylindrical storage capacitor is fabricated as shown in FIGS. 1A to 1C. The process starts with preparation of a silicon substrate 101. Dopant impurity is introduced into a surface portion of the silicon substrate 101, and is opposite in conductivity type to that of the silicon substrate 101. An inter-layered insulating layer 103 is deposited over the entire surface of the silicon substrate 101, and the impurity region 102 is covered with the inter-layered insulating layer 103. A node contact hole is formed in the inter-layered insulating layer 103 by using a photo-lithography and an etching technique, and the impurity region 102 is exposed to the node contact hole. Phosphorous-doped polysilicon is deposited over the entire surface of the resultant structure. The node contact hole is filled with the phosphorous-doped polysilicon, and the phosphorous-doped polysilicon forms a layer on the inter-layered insulating layer 103. The phosphorous-doped polysilicon layer is removed from the resultant structure. There remains a contact plug 105 of the phosphorous-doped polysilicon in the node contact hole.

Subsequently, insulating material is deposited over the inter-layered insulating layer 103, and the contact plug 105 is covered with the insulating layer 106. A groove is formed in the insulating layer 106 by using the photo-lithography and an etching technique, and the contact plug 104 is exposed to the groove. Conductive material is deposited over the entire surface of the resultant structure, and a conductive layer 108 is conformably formed on the entire surface. The inner surfaces, which define the groove, are covered with the conductive layer 108. Insulating material such as silicon oxide is deposited over the entire surface of the resultant structure, and the silicon oxide layer is conformably laminated on the conductive layer 108. The resultant structure is subjected to an etch-back, and the silicon oxide layer is anisotropically etched until the conductive layer 108 is exposed, again. A reactive ion etching technique is used as the anisotropic etching. Then, there remains a side wall spacer 109 on the vertical portions of the conductive layer 108 as shown in FIG. 1A.

Subsequently, conductive material is deposited over the entire surface of the resultant structure, and a conductive layer 110 is conformably formed on the entire surface of the resultant structure. The side wall spacer 109 is sandwiched between the inner conductive layer 108 and the outer conductive layer 110 (see FIG. 1B). However, the horizontal portions of the conductive layer 108 are directly laminated with the conductive layer 110.

The resultant structure is subjected to the etch-back, and the conductive layers 108/110 are anisotropically etched away. There remain the conductive layers 108/110 on the vertical inner surfaces and the bottom surface defining the groove. Thus, an outer conductive cylinder 111 and an inner conductive cylinder 112 are formed from the conductive layers 108 and 110, respectively, as shown in FIG. 1C.

The side wall spacer 109 is selectively etched away, and the outer conductive cylinder 111 and the inner conductive cylinder 112 are left in the groove. The outer conductive cylinder 111 and the inner conductive cylinder 112 are electrically connected through the conductive plug 105 to the impurity region 102, and serve as a cylindrical storage electrode of a storage capacitor.

The prior art cylindrical storage electrode has the double cylindrical structure, and the side wall spacer 109 is indispensable for the separation deposition of insulating material and the etch-back are required for the side wall spacer 109. A problem is encountered in the prior art fabrication process in the applicability to the next generation. In detail, a semiconductor dynamic random access memory device of the next generation is to have a cylindrical stacked electrode with more than two conductive cylinders. Accordingly, more than one side wall spacer is required for the cylindrical stacked electrode. If the prior art fabrication process is applied to the cylindrical stacked electrode, the deposition of silicon oxide and the etch-back are repeated more than once. The side wall spacers would make the fabrication process complicated, and the production cost is increased. This results that the semiconductor dynamic random access memory device of the next generation is so expensive. Thus, the prior art fabrication process is not appropriate to the semiconductor dynamic random access memory device of the next generation.

SUMMARY OF THE INVENTION

It is therefore an important object of the present invention to provide a process for fabricating a semiconductor device which is simple and economical.

To accomplish the object, the present invention proposes to simultaneously form a multiple cylindrical electrode after deposition of conductive layers alternated with mask layers.

In accordance with one aspect of the present invention, there is provided a process for fabricating a semiconductor integrated circuit device comprising the steps of a) forming a groove in a first insulating layer over a semiconductor substrate, b) conformably forming, a conductive layer and a mask layer on an upper surface of the first insulating layer and an inner surface defining, the groove, c) repeating the step b) so that plural conductive layers and the plural mask layers form in combination a lamination conformably extending on the upper surface and the inner surface, d) anisotropically etching the lamination so as to form a multiple cylindrical structure in the groove, c) completing a multiple cylindrical electrode on the basis of the multiple cylindrical structure and f) opposing a counter electrode to the multiple cylindrical electrode through a dielectric layer so as to complete a capacitor.

BRIEF DESCRIPTION OF THE DRAWINGS

The features and advantages of the process will be more clearly understood from the following description taken in conjunction with the accompanying drawings in which.

DESCRIPTION OF THE PREFERRED EMBODIMENTS

First Embodiment

FIGS. 2A to 2F illustrate a process for fabricating a dynamic random access memory device embodying the present invention. The dynamic random access memory cell is of the one-transistor one-capacitor type, and is implemented by a series combination of an access transistor and a cylindrical stacked capacitor. The series combination of the access transistor and the cylindrical stacked capacitor is arranged in the direction perpendicular to the papers where the cross sections are drawn. For this reason, only the cylindrical storage capacitor is shown in FIGS. 2A to 2F, and the access transistor is not shown.

Figure 1A:
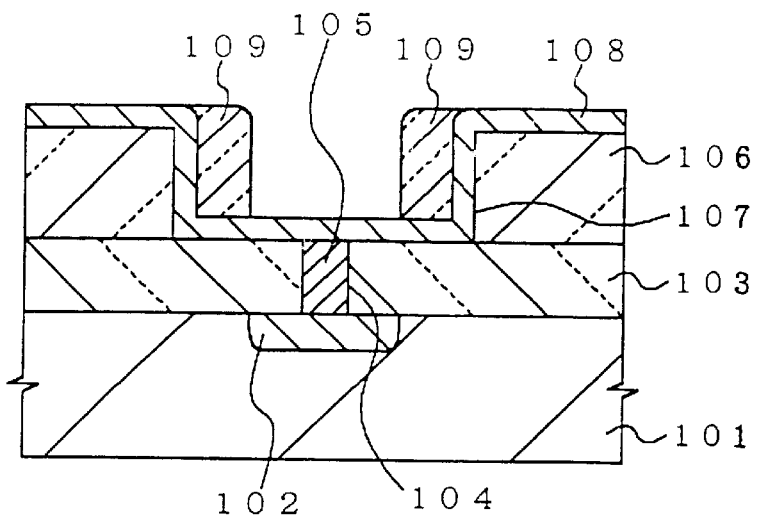
FIGS. 1A to 1C are cross sectional views showing the essential steps of the prior art process for fabricating the cylindrical stacked capacitor.
Figure 1B:
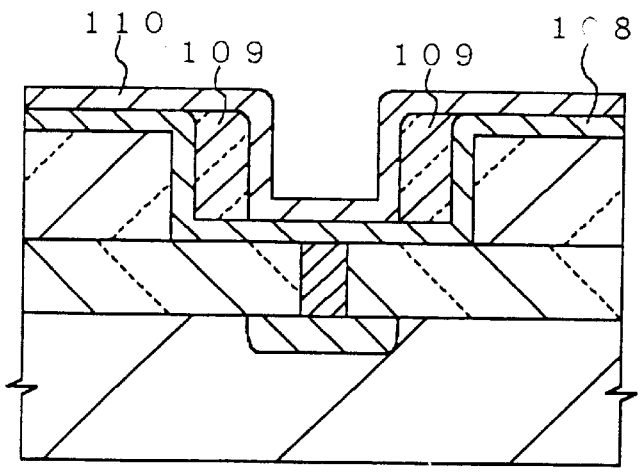
Figure 1C:
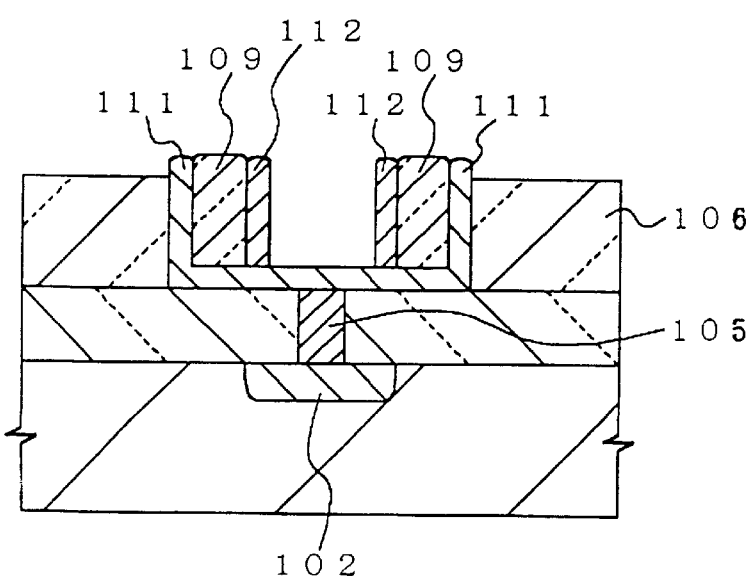
Figure 2A:
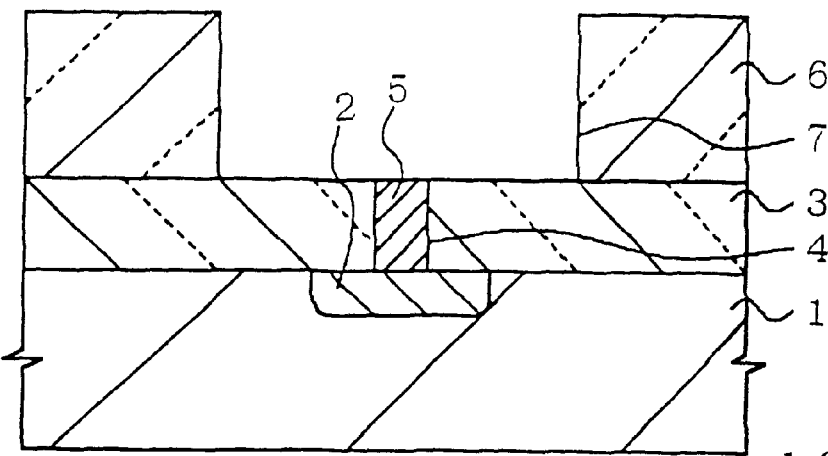
FIGS. 2A to 2F are cross sectional views showing essential steps of a process for fabricating a storage capacitor incorporated in a semiconductor dynamic random access memory device according to the present invention.

The process starts with preparation of a p-type silicon substrate 1. First, an isolating region is selectively formed in the major surface of the p-type silicon substrate 1, and an active region is defined in the surface portion of the p-type silicon substrate 1. Silicon oxide is grown on the active region, and forms a thin gate insulating layer. Conductive material such as polysilicon is deposited over the entire surface of the resultant structure, and is patterned into a word line (not shown). N-type dopant impurity is ion implanted into the active region, and forms lightly doped n-type source/drain regions (not shown) on both sides of the word line. Insulating material such as silicon oxide is deposited over the entire surface of the resultant structure, and forms a silicon oxide layer (not shown). The silicon oxide layer is anisotropically etched away so as to form side wall spacers (not shown) on both sides of the word line. N-type dopant impurity is ion implanted into the active region, and forms heavily doped n-type source/drain regions on both sides of the lightly doped source/drain regions. The heavily doped n-type source region is shown in FIG. 2A, and is labeled with reference numeral 2. The word line and the heavily doped n-type source/drain regions may be covered with refractory metal silicide layers. The refractory metal silicide layers are laminated thereon as follows. Refractory metal is deposited over the entire surface of the resultant structure, and forms a refractory metal layer. The resultant structure is treated with heat. The refractory metal reacts with the silicon, and is partially converted to refractory metal silicide. The residual refractory metal is etched away, and the refractory metal silicide layers (not shown) are left on the heavily doped n-type source/drain regions and the word line. Thus, the access transistor is firstly fabricated on the p-type silicon substrate 1.

Subsequently, silicon oxide is deposited to 500 nanometers thick over the entire surface of the resultant structure by using a chemical vapor deposition technique, and forms an inter-layered insulating layer 3. A photo-resist etching mask (not shown) is formed on the inter-layered insulating layer 3 by using a photo-lithography, and has a hollow space over the heavily-doped n-type source region 2. The inter-layered insulating layer 3 is anisotropically etched away so as to form a node contact hole 4 therein. The heavily doped n-type source region 2 is exposed to the node contact hole 4. Conductive material such as, for example, n-type doped polysilicon is deposited over the entire surface of the resultant structure. The node contact hole 4 is filled with the n-type doped polysilicon, and the n-type doped polysilicon swells into an n-type doped polysilicon layer on the inter-layered insulting layer 3. The n-type doped polysilicon layer is etched away, and a node contact plug 5 is left in the node contact hole 4. The note contact plug 5 may be formed of tungsten silicide.

Subsequently, phospho-silicate glass is deposited to 800 nanometers thick over the entire surface of the resultant structure by using a chemical vapor deposition, and forms an insulating layer 6. A photo-resist etching mask (not shown) is formed on the insulating layer 6 by using the photo-lithography. A hollow space is formed in the photo-resist etching mask, and a part of the insulating layer 6 over the node contact plug 5 is exposed to the hollow space. Using the photo-resist etching mask, the insulating layer 6 is selectively etched away by using a dry etching technique, and a groove is formed in the insulating layer 6 as shown in FIG. 2A. The groove measures 0.5 micron by 0.5 micron. It is preferable not to reduce the inter-layered insulating layer 3 in thickness during the dry etching. Etching gas has the selectivity larger to the phospho-silicate glass than the silicon oxide. Such a large selectivity is achieved by using gaseous mixture containing $CHF_3$, $CF_4$ and CO. Otherwise, the manufacturer experimentally determines an etching time, and controls the depth in the groove.

The resultant structure is put into a reaction chamber of a low-pressure chemical vapor deposition system (not shown). Firstly, phosphorous-doped amorphous silicon is deposited to 100 nanometers thick over the entire surface, and conformably forms a conductive layer 8. The reaction chamber is regulated to 400 degrees to 500 degrees in centigrade. Subsequently, oxygen is introduced into the reaction chamber, and is absorbed into a surface portion of the first conductive layer 8. The surface portion becomes insulating, and makes it porous. The porous insulating layer 9 is mixture between silicon and oxygen, and is as thin as 1 nanometer.

Figure 2B:
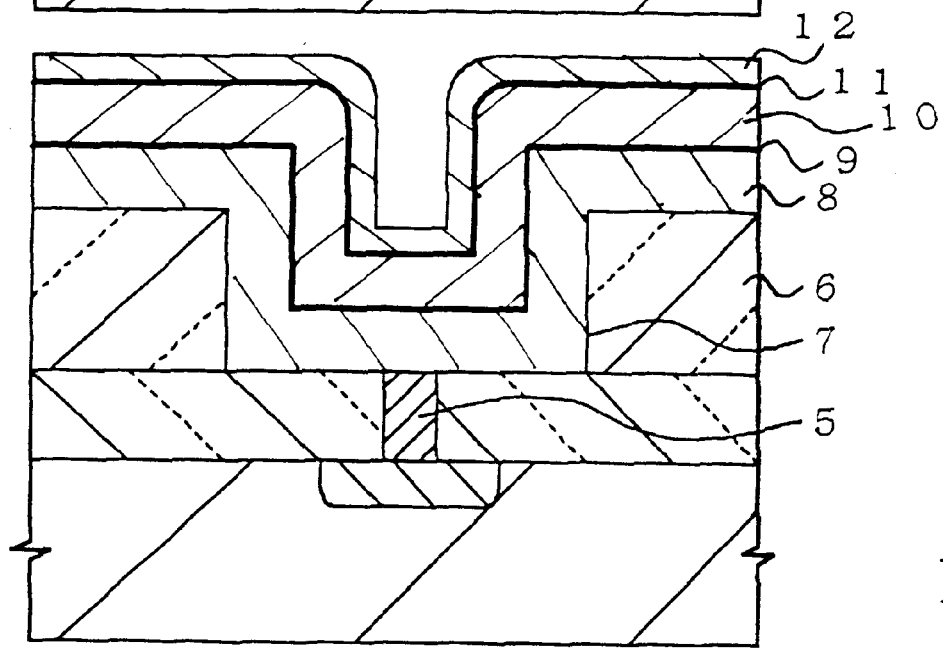

The deposition of phosphorous-doped amorphous silicon and the oxidation are repeated without taking out the resultant structure from the reaction chamber. As a result, a conductive layer 10 is laminated on the insulating layer 9, and a surface portion of the conductive layer 10 is converted to an insulating layer 11. The conductive layer 10 and the insulating layer 11 are same as the conductive layer 8 and the insulating layer 9, respectively. The phosphorous-doped amorphous silicon is deposited to 25 nanometers thick over the entire surface, and conformably forms a conductive layer 12. Thus, the conductive layer 8, the insulating layer 9, the conductive layer 10, the insulating layer 11 and the conductive layer 12 are successively laminated over the insulating layer 6 as shown in FIG. 2B.

Figure 2C:
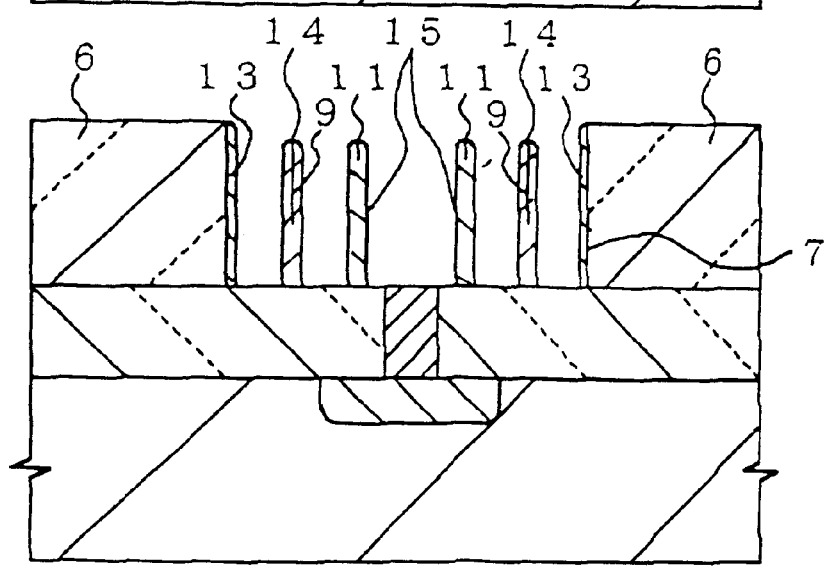

Subsequently, the resultant structure is subjected to an etch-back. Namely, the conductive layers 8/10/12 and the insulating layers 9/11 are anisotropically etched without any photo-resist etching mask. The anisotropic etching gas contains $Cl_2$ and HBr. The conductive layer 12 is firstly etched, and the conductive layer 10 follows. Finally, the conductive layer 8 is anisotropically etched. The insulating layers 11 and 9 serve as a kind of etching mask. The phosphorous-doped amorphous silicon remains on the vertical portions of the insulating layers 11 and 9. However, the phosphorous-doped amorphous silicon is anisotropically etched away from between the vertical portions of the insulating layers 9/11. As a result, conductive cylindrical walls 13, 14 and 15 are left in the groove 9 as shown in FIG. 2C. The conductive cylindrical wall 13 is formed on the inner surfaces of the insulating layer 6, and extends along the periphery of the groove 7. The conductive cylindrical wall 14 is nested in the conductive cylindrical wall 13, and is spaced therefrom. The conductive cylindrical wall 15 is nested in the conductive cylindrical wall 14, and is spaced therefrom. The conductive cylindrical walls 13/14/15 are 30 nanometers wide.

Figure 2D:
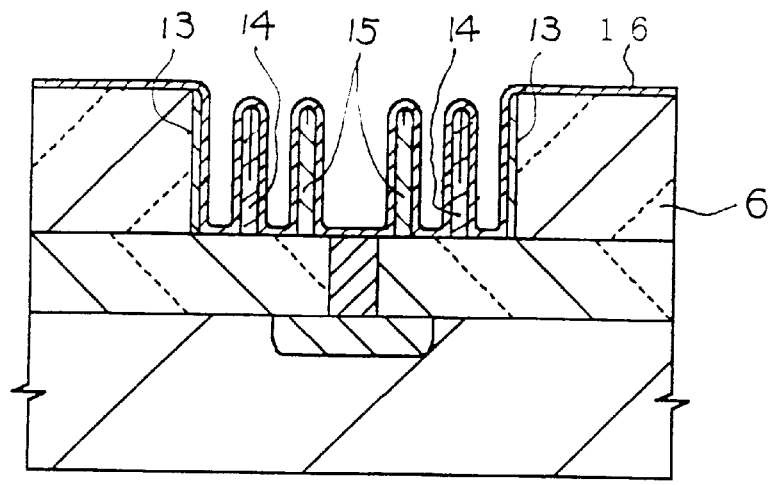

Subsequently, amorphous silicon is deposited to 10 nanometers thick over the entire surface of the resultant structure, and conformably forms a reinforcing conductive layer 16 as shown in FIG. 2D. The resultant structure is treated with heat at 800 degrees in centigrade. While the heat is being applied, the conductive cylindrical walls 13/14/15 are integral with the reinforcing conductive layer 16, and the insulating layers 9 and 11 are extinguished due to an out-diffusion of the oxygen. The conductive cylindrical walls 13/14/15 and the reinforcing conductive layer 16 form a multiple cylindrical wall structure formed of doped poly-silicon.

Photo-resist is spread over the entire surface of the resultant structure, and forms a photo-resist layer. The entire surface of the photo-resist layer is exposed to light, and, thereafter, developing solution is applied to the photo-resist layer. The photo-resist layer is partially removed, and is left in the gaps between the conductive cylindrical walls 13/14/15 of the multiple cylindrical wall structure. Thus, a photo-resist etching mask 17 is formed from the photo-resist layer.

Figure 2E:
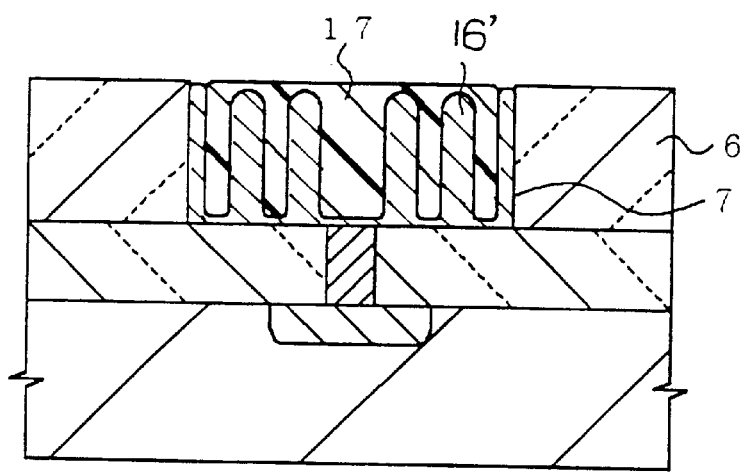

Using the photo-resist etching mask 17, the reinforcing conductive layer 16 on the insulating layer 6 is etched away. Upon completion of the etching, a multiple cylindrical storage electrode 16' is left in the groove as shown in FIG. 2E. The photo-resist etching mask 17 is removed from the resultant structure.

Figure 2F:
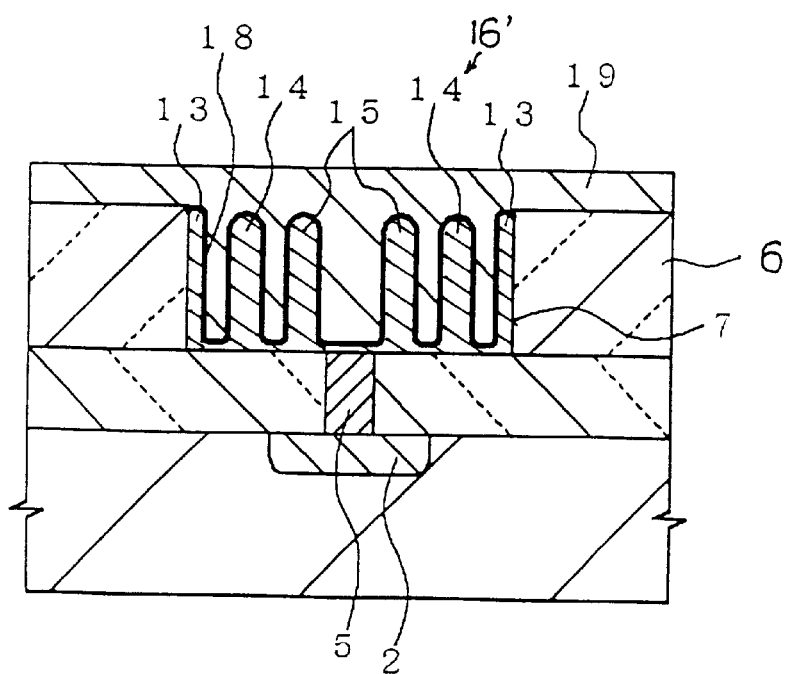

Subsequently, a dielectric layer 18 is formed on the entire surface of the resultant structure, and conductive material is deposited over the dielectric layer 18. A photo-resist etching mask (not shown) is formed on the conductive layer, and the conductive layer is patterned into a plate electrode 19. The photo-resist etching mask is stripped off. Thus, the multiple cylindrical storage electrode 16' is opposed to the plate electrode 19 through the dielectric layer 18 as shown in FIG. 2F, and is electrically connected through the node contact plug 5 to the heavily-doped n-type source region 2 of the access transistor. The multiple cylindrical storage electrode 16', the dielectric layer 18 and the plate electrode 19 as a whole constitute the cylindrical storage capacitor.

As will be understood from the foregoing description, the conductive cylindrical walls 13/14/15 are concurrently patterned through the etch-back after the low-pressure chemical vapor deposition. Even if more than three conductive cylindrical walls are required for a multiple cylindrical storage electrode, the low-pressure chemical vapor deposition is carried out once, and more than three conductive cylindrical walls are concurrently patterned through an etch-back. Therefore, the process according to the present invention is simpler than the prior art process, and the production cost for the semiconductor dynamic random access memory device is reduced.

Second Embodiment

FIGS. 3A to 3E illustrate another process for fabricating a semiconductor dynamic random access memory device embodying the present invention. The process implementing the second embodiment is different from the first embodiment in that an etching stopper is formed between the inter-layered insulating layer 6 and the phosphorous-doped amorphous silicon layer 8. Other layers and regions are labeled with the same reference numerals designating corresponding layers and regions shown in FIGS. 2A to 2F.

The dynamic random access memory cell is implemented by a series combination of an access transistor and a cylindrical storage capacitor as similar to that of the first embodiment. The access transistor is fabricated through the steps forming parts of the process implementing the first embodiment, and the steps are not described hereinbelow for avoiding repetition.

Upon completion of the access transistor, the cylindrical storage capacitor is fabricated as follows. Silicon oxide is deposited over the p-type silicon substrate 1, and the access transistor is covered with the inter-layered insulating layer 3. A node contact hole is formed in the inter-layered insulating layer 3 through the photo-lithography and the anisotropic etching, and the node contact hole is filled with the node contact plug 5. The phospho-silicate glass is deposited over the entire surface of the resultant structure, and forms the insulating layer 6. The photo-resist etching mask is formed on the insulating layer 6, and the insulating layer 6 is selectively etched away so as to form the groove 7 in the insulating layer 6. Thus, the early stage of the process implementing the second embodiment is similar to that of the first embodiment.

Figure 3A:
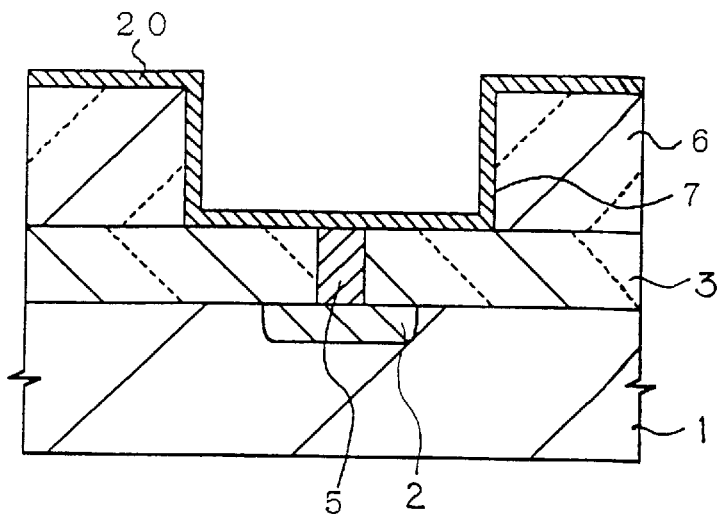
FIGS. 3A to 3E are cross sectional views showing essential steps of another process for fabricating a storage capacitor incorporated in a semiconductor dynamic random access memory device according to the present invention.

Subsequently, tungsten silicide is deposited to 20 nanometers thick over the entire surface of the resultant structure, and forms an etching stopper layer 20. The etching stopper layer 20 conformably extends along the surface of the resultant structure as shown in FIG. 3A.

Figure 3B:
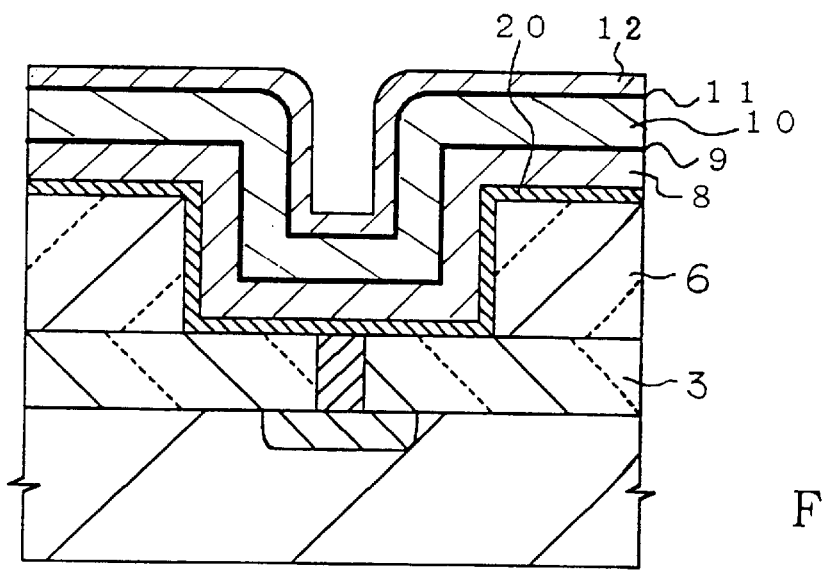

The resultant structure is put in the reaction chamber of the low-pressure chemical vapor deposition system, and the reactant gases for the phosphorous-doped amorphous silicon and the oxygen are alternately introduced into the reaction chamber. The conductive layers 8/10/12 and the insulating layers 9/11 are alternately laminated over the etching stopper layer 20 as shown in FIG. 3B. The insulating layers 9/11 are thicker than those of the first embodiment. In order to make the insulating layers 9/11 thicker than those of the first embodiment, the phosphorous-doped amorphous silicon layers 8/10 are exposed to the oxygen longer than those of the first embodiment.

Figure 3C:
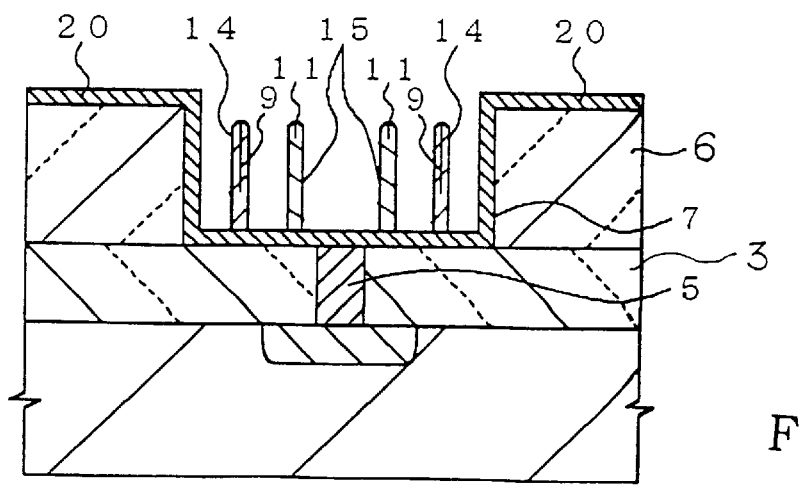

The resultant structure is subjected to the etch-back. The reactive ion etching is used in the etch-back, and the etching gas contains HBr. The vertical portions of the insulating layers 9/11 serve as a kind of etching mask, and the anisotropic etching vertically proceeds in the phosphorous-doped amorphous silicon between the vertical portions of the insulating layers 9/11. Thus, the phosphorous-doped amorphous silicon layers 8/10/12 are anisotropically etched, and the conductive cylindrical walls 14/15 are left in the groove. The conductive cylindrical walls 14/15 are 50 nanometers thick. The etching rate on the tungsten silicide is negligible. The etching stopper layer 20 prohibits the node contact plug 5 from the etching gas, and the reactive ion etching is terminated on the surface of the etching stopper layer 20. As a result, the conductive cylindrical wall 14 is nested in the vertical wall of the etching stopper layer 20, and the conductive cylindrical wall 15 is nested in the conductive cylindrical wall 14 as shown in FIG. 3C.

Subsequently, the resultant structure is subjected to the heat treatment around 800 degrees in centigrade. The oxygen is diffused out from the insulating layers 9/11, and the phosphorous doped amorphous silicon is converted to phosphorous-doped polysilicon. The conductive cylindrical walls 14/15 of phosphorous-doped polysilicon are left on the tungsten silicide layer 20 in the groove.

Figure 3D:
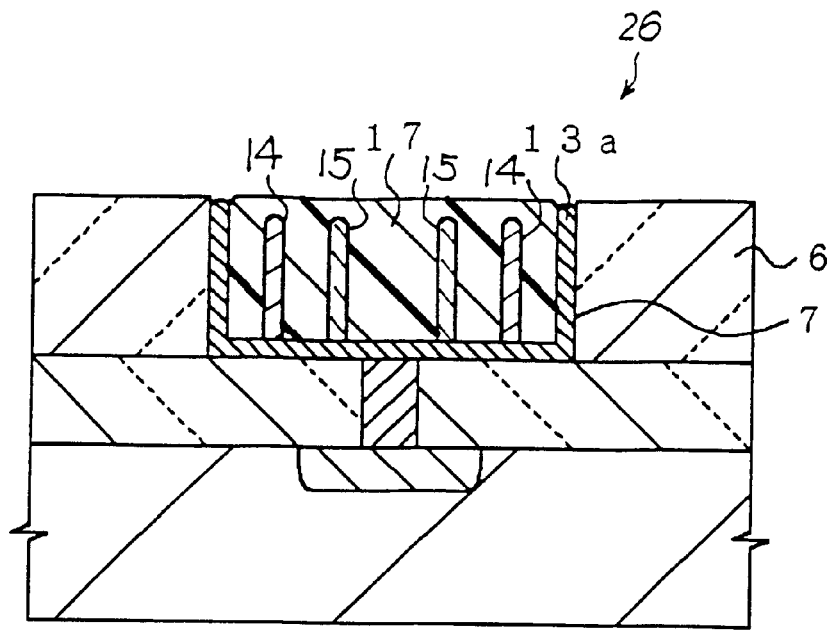

The photo-resist etching mask 17 is formed in the groove as similar to that of the first embodiment, and the tungsten silicide layer 20 is selectively etched away. The tungsten silicide layer 20 on the insulating layer 6 is removed, and a tungsten silicide cup 13a is left in the groove 7 as shown in FIG. 3D. The conductive cylindrical walls 14/15 project from the bottom portion of the tungsten silicide cup 13a, and the conductive cylindrical wall 14 is nested in the tungsten silicide cup 13a. The tungsten silicide cup 13a and the conductive cylindrical walls 14/15 form in combination a multiple cylindrical storage electrode 26.

Figure 3E:
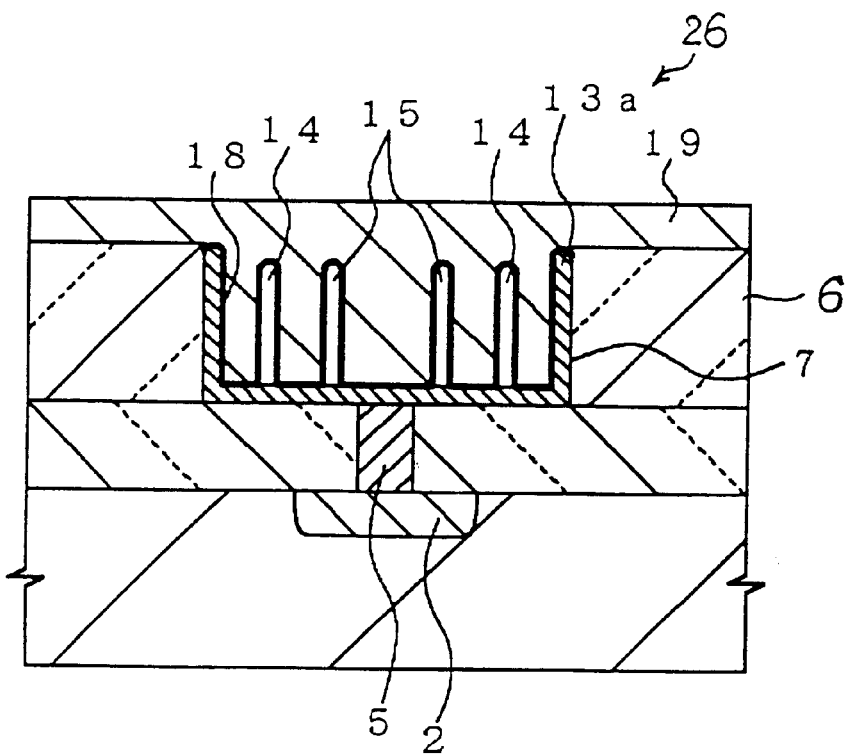

The photo-resist etching mask 17 is removed from the resultant structure. A dielectric layer 18 is formed on the entire surface of the resultant structure, and conductive material is deposited over the dielectric layer 18. A photo-resist etching mask (not shown) is formed on the conductive layer, and the conductive layer is patterned into a plate electrode 19. The photo-resist etching mask is stripped off, and the cylindrical storage capacitor is completed as shown in FIG. 3E. The multiple cylindrical storage electrode 26 is electrically connected through the node contact plug 5 to the heavily-doped n-type source region 2 of the access transistor.

As will be understood from the foregoing description, the conductive cylindrical walls 14/15 are simultaneously patterned through the etch-back after the low-pressure chemical vapor deposition, and the fabrication process is simpler than the prior art fabrication process. Moreover, the tungsten silicide layer 20 not only serves as the etching stopper but also is patterned into the outermost conductive cylindrical wall 13a. The etching stopper layer 20 prevents the node contact plug 5 from the etching gas. The node contact plug 5 is never damaged in the reactive ion etching. Thus, the etching stopper layer 20 enhances the production yield, and the multiple cylindrical storage electrode 26 is accurately patterned in the groove 7.

Third Embodiment

Figure 4:
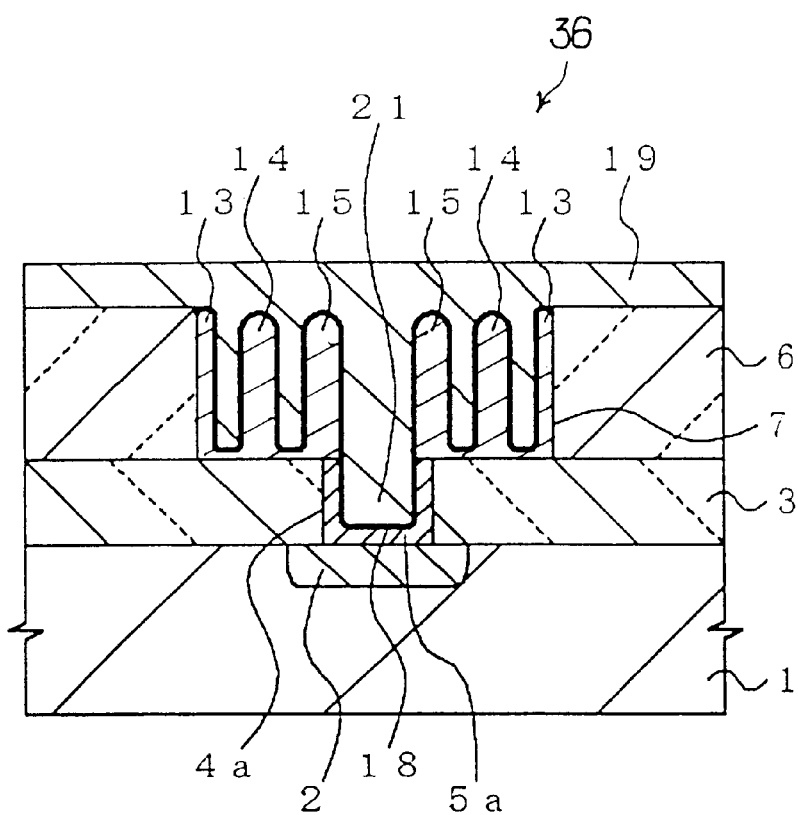
FIG. 4 is a cross sectional view showing) the structure of a storage capacitor fabricated through yet another process according to the present invention.

FIG. 4 illustrates a cylindrical storage capacitor fabricated through yet another process embodying the present invention. The cylindrical storage capacitor is different from the first embodiment in that a node contact plug 5a forms a part of a multiple cylindrical storage electrode 36. The cylindrical storage capacitor is connected in series to an access transistor, and forms a dynamic random access memory cell together with the access transistor.

The access transistor is fabricated through the steps similar to those of the first embodiment. The heavily-doped n-type source region 2 is shown in FIG. 4. Upon completion of the access transistor, silicon oxide is deposited over the entire surface of the p-type silicon substrate 1, and forms the inter-layered insulating layer 3.

Subsequently, a node contact hole 4a is formed in the inter-layered insulating layer 3. The node contact hole 4a is wider than the node contact hole 4. A node contact plug 5a is formed in the node contact hole 4a. The phosphosilicate class is deposited over the entire surface of the resultant structure, and forms the insulating layer 6. A photo-resist etching mask (not shown) is formed on the insulating layer 6, and the insulating layer 6 is selectively etched away so as to form a groove 7 in the insulating layer 6.

Subsequently, the resultant structure is put in the reaction chamber of the low-pressure chemical vapor deposition system, and the reactant gases and the oxygen are alternately introduced into the reaction chamber. As a result, the conductive layers 8/10/12 are alternated with the insulating layers 9/11.

The resultant structure is subjected to the etch-back. The phosphorousdoped amorphous silicon is vertically etched by using the reactive ion etching for forming the conductive cylindrical walls 13/14/15. However, the reactive ion etching is continued after the upper surface of the node contact plug 5a is exposed to the groove 7. The node contact plug 5a is exposed to the ion bombardment, and a recess 21 is formed in the node contact plug 5a.

After the formation of the recess, the process sequence is similar to that of the first embodiment. The dielectric layer 18 is formed on the surface of the multiple cylindrical storage electrode 36, and the inner surface of the node contact plug 5a forms a part of the surface of the multiple cylindrical storage electrode 36. Finally, the plate electrode 19 is opposed to the multiple cylindrical storage electrode 36 through the dielectric layer 18.

The process implementing the third embodiment achieves all the advantages of the first embodiment. The node contact plug 5a forms a part of the multiple cylindrical storage electrode 36, and increases the surface of the multiple cylindrical storage capacitor 36. For this reason, the cylindrical storage capacitor of the third embodiment occupies narrow real estate without reduction of the capacitance.

As will be appreciated From the foregoing description, the conductive cylindrical walls are simultaneously formed through the etch-back after the chemical vapor deposition, and the process according to the present invention is simpler than the prior art process. This results in reduction of the production cost.

Although particular embodiments of the present invention have been shown and described, it will be apparent to those skilled in the art that various changes and modifications may be made without departing from the spirit and scope of the present invention.

First, the process according to the present invention is available for a capacitor incorporated in any kind of semiconductor integrated circuit device.

More than three conductive cylindrical walls may form a multiple cylindrical storage electrode according to the present invention. In this instance, the introduction of the reactant gases and the oxygen are repeated three times or more.

Hemispherical grains may be formed on the surface of the multiple cylindrical storage electrode for increasing the surface area. The multiple cylindrical storage electrode with the hemispherical grains occupies the real estate narrower than that of the first embodiment without reduction of the capacitance.

The insulating layers 9/11 may be formed of silicon nitride or conductive material resistive against the etchant. In other words, the conductive material is expected to have the etching rate less than that of the phosphorous-doped amorphous silicon. Another kind of semiconductor or conductive material may be used for the formation of the conductive cylindrical walls. For example, titanium nitride may be deposited over the silicon layers. The titanium nitride layer is of the order of 5 nanometers thick. In this instance, the titanium nitride layers are alternated with the silicon layers, and the vertical portions of the titanium nitride layers serve as the kind of etching mask.

Arsenic may be in situ doped in the silicon for forming the conductive layers 8/10/12. Otherwise, phosphorous or arsenic may be doped into intrinsic silicon layers after the deposition.

What is claimed is:

1. A process for fabricating a semiconductor integrated circuit device, comprising the steps of:
   a) forming a groove in a first insulating layer over a semiconductor substrate;
   b) conformably forming a conductive layer and a mask layer on an upper surface of said first insulating layer and an inner surface defining said groove;
   c) repeating said step b) so that plural conductive layers and the plural mask layers form in combination a lamination conformably extending on said upper surface and said inner surface;
   d) anisotropically etching said lamination so as to form a multiple cylindrical structure in said groove;
   e) completing a multiple cylindrical electrode on the basis of said multiple cylindrical structure; and
   f) opposing a counter electrode to said multiple cylindrical electrode through a dielectric layer so as to complete a capacitor.

2. The process as set forth in claim 1, in which said steps b) and c) are continuously carried out in a reaction chamber of a deposition system.

3. The process as set forth in claim 2, in which said deposition system is a low-pressure chemical vapor deposition system.

4. The process as set forth in claim 2, in which semiconductor layers are intermittently deposited as said plural conductive layers.

5. The process as set forth in claim 4, in which said semiconductor layers are alternated with said plural mask layers formed of insulating material.

6. The process as set forth in claim 5, in which said insulating material is mixture between semiconductor material and oxygen.

7. The process as set forth in claim 6, in which said step e) includes the substeps of
   e-1) depositing semiconductor material identical with the semiconductor material used for said semiconductor layers on said multiple cylindrical structure for reinforcing said multiple cylindrical structure,
   e-2) heating the resultant structure of said sub-step e-1) so as to convert said mixture to said semiconductor material through an out-diffusion of oxygen, and
   e-3) patterning the resultant structure of said sub-step e-2) into said multiple cylindrical electrode.

8. The process as set forth in claim 7, in which the semiconductor material used for said semiconductor layers is doped amorphous silicon to be converted to doped polysilicon in said step e-2), and said mask layers are formed of mixture between silicon and oxygen to be converted to said doped polysilicon in said step e-2).

9. The process as set forth in claim 8, in which the doped amorphous silicon layers are anisotropically etched through a reactive ion etching using gaseous etchant containing $Cl_2$ and HBr in said step d) so that plural cylindrical walls are successively nested for forming said multiple cylindrical structure.

10. The process as set forth in claim 5, in which said insulating material is silicon nitride.

11. The process as set forth in claim 1, in which a second insulating layer is formed between said first insulating layer and said semiconductor substrate, and a contact plug is embedded in said second insulating layer in such a manner as to be exposed to said groove.

12. The process as set forth in claim 11, in which refractory metal silicide is deposited over said upper surface and said inner surface as said conductive layer in said step b), and said plural conductive layers includes the refractory metal silicide layer and semiconductor layers upon completion of said step c).

13. The process as set forth in claim 12, in which the anisotropic etching is terminated at reaching said refractory metal silicide layer so that said refractory metal silicide layer serves as an etching stopper in said step d).

14. The process as set forth in claim 12, in which said refractory metal silicide, the semiconductor material used for said semiconductor layers and the material used for said mask layers are tungsten silicide, doped amorphous silicon and mixture between silicon and oxygen, respectively.

15. The process as set forth in claim 14, in which gaseous etchant containing HBr is used in a reactive ion etching) carried out in said step d).

16. The process as set forth in claim 14, in which said step e) includes the sub-steps of
   e-1) heating said multiple cylindrical structure so as to convert said doped amorphous silicon and said mixture to doped polysilicon through crystallization and an out-diffusion of oxygen, and
   e-2) patterning the resultant structure of said sub-step e-1) into said multiple cylindrical electrode.

17. The process as set forth in claim 12, in which said refractory metal silicide, the semiconductor material used for said semiconductor layers and the material used for said mask layers are tungsten silicide, doped amorphous silicon and silicon nitride, respectively.

18. The process as set forth in claim 11, in which a recess is formed in an upper portion of said contact plug in said step d), and the upper surface defining said recess is covered with said dielectric layer in said step f).

19. The process as set forth in claim 1, in which said capacitor serves as a storage capacitor of a dynamic random access memory cell.

20. The process as set forth in claim 19, in which a node contact plug exposed to said groove is formed in a second insulating layer between said first insulating layer and said semiconductor substrate, and is electrically connected between said multiple cylindrical electrode and a source region of an access transistor formed in said substrate.

21. A method for making a semiconductor device, comprising:
   (a) forming a groove in a first insulating layer over a substrate;
   (b) forming a first conductive layer over an inner surface of said groove such that said first conductive layer substantially conforms to a groove shape substantially corresponding to said inner surface;
   (c) forming a first mask layer over said inner surface of said groove such that said first mask layer substantially conforms to said groove shape;
   (d) forming a second conductive layer over said inner surface of said groove such that said second conductive layer substantially conforms to said groove shape;
   (e) forming a second mask layer over said inner surface of said groove such that said second mask layer substantially conforms to said groove shape; and
   (f) etching said first conductive layer, said first mask layer, said second conductive layer, and said second mask layer to form a multiple cylindrical structure in said groove.

22. The method as claimed in claim 21, wherein said operation (c) is preformed after said operation (b), wherein said operation (d) is performed after said operation (c), and wherein said operation (e) is performed after said operation (d).

23. The method as claimed in claim 21, wherein said first conductive layer, said first mask layer, said second conductive layer, and said second mask layer form a laminate layer.

24. The method as claimed in claim 23, wherein said first mask layer is formed over said first conductive layer, said second conductive layer is formed over said first mask layer, and said second mask layer is formed over said second conductive layer.

25. The method as claimed in claim 24, wherein said operation (f) comprises:
   (f1) using a vertical portion of said first mask layer and a vertical portion of said second mask layer as masks for an etching process; and
   (f2) performing said etching process such that a first vertical portion of said first conductive layer forms at least a portion of a first cylindrical wall of said multiple cylindrical structure and such that a first vertical portion of said second conductive layer forms at least a portion of a second cylindrical wall of said multiple cylindrical structure.

26. The method as claimed in claim 25, wherein said laminate layer comprises a third conductive layer formed over said second mask layer,
   wherein said first vertical portion of said first conductive layer and a second vertical portion of said second conductive layer form at least a portion of said first cylindrical wall, and
   wherein said first vertical portion of said second conductive layer and a first vertical portion of said third conductive layer form at least a portion of said second cylindrical wall.

27. The method as claimed in claim 25, further comprising:
   (g) removing said vertical portion of said first mask layer from said first cylindrical wall, and
   (h) removing said vertical portion of said second mask layer from said second cylindrical wall.

28. The method as claimed in claim 27,
   wherein said operation (g) comprises:
      (g1) removing said vertical portion of said first mask layer from said first cylindrical wall via a heating process, and
   wherein said operation (h) comprises:
      (h1) removing said vertical portion of said second mask layer from said second cylindrical wall via a heating process.

29. The method as claimed in claim 25, further comprising:
   (g) forming a dielectric layer over said multiple cylindrical structure; and
   (h) forming an electrode layer over said dielectric layer.

30. The method as claimed in claim 25, further comprising:
   (g) forming an etch stop layer over said inner surface, wherein said etch stop layer is formed between said laminate layer and said inner surface.

31. The method as claimed in claim 25, further comprising:
   (g) forming a second insulating layer between said substrate and said first insulating layer;
   (h) forming a contact hole through said second insulating layer;
   (i) forming a contact plug in said contact hole.

32. The method as claimed in claim 31, wherein said operation (f) further comprises:
   (f3) etching a portion of said contact plug such that a surface area of said second cylindrical wall is greater than a surface area of said first cylindrical wall.

33. The method as claimed in claim 21, further comprising:
   (g) forming an etch stop layer over said inner surface, wherein said etch stop layer is formed between said first conductive layer and said inner surface.

* * * * *